(12) United States Patent  
Hoivik et al.

(10) Patent No.: US 7,876,565 B2
(45) Date of Patent: *Jan. 25, 2011

(54) METHOD OF OBTAINING ENHANCED LOCALIZED THERMAL INTERFACE REGIONS BY PARTICLE STACKING

(75) Inventors: Nils D. Hoivik, Billingstad (NO); Ryan Linderman, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 270 days.

This patent is subject to a terminal disclaimer.

(21) Appl. No.: 12/164,576

(22) Filed: Jun. 30, 2008

(65) Prior Publication Data

US 2009/0016028 A1    Jan. 15, 2009

Related U.S. Application Data

(63) Continuation of application No. 11/358,501, filed on Feb. 21, 2006, now Pat. No. 7,394,657.

(51) Int. Cl.
- *H05K 7/20* (2006.01)
- *H01L 23/34* (2006.01)
- *H01L 21/00* (2006.01)
- *F28F 7/00* (2006.01)

(52) U.S. Cl. ................... 361/704; 165/80.2; 165/80.3; 165/185; 257/707; 257/703; 361/708; 361/710; 361/718; 361/722; 438/106

(58) Field of Classification Search ................... None
See application file for complete search history.

(56) References Cited

U.S. PATENT DOCUMENTS

| | | | |
|---|---|---|---|
| 5,440,172 A | 8/1995 | Sutrina | |
| 6,462,410 B1 | 10/2002 | Novotny et al. | |
| 6,566,743 B1 * | 5/2003 | Zuo | ........................ 257/678 |
| 6,837,306 B2 | 1/2005 | Houle et al. | |
| 6,886,625 B1 | 5/2005 | Sagal et al. | |
| 6,896,045 B2 | 5/2005 | Panek | |
| 6,974,723 B2 | 12/2005 | Matayabas, Jr. et al. | |
| 7,169,650 B2 | 1/2007 | Rinella et al. | |
| 7,180,179 B2 | 2/2007 | Mok et al. | |
| 7,190,585 B2 | 3/2007 | Houle | |
| 7,195,951 B2 | 3/2007 | Houle et al. | |
| 7,288,839 B2 * | 10/2007 | Colgan et al. | ............... 257/707 |
| 2002/0023733 A1 | 2/2002 | Hall et al. | |
| 2003/0075312 A1 | 4/2003 | Panek | |
| 2004/0118501 A1 | 6/2004 | Chiu et al. | |
| 2005/0126766 A1 | 6/2005 | Lee et al. | |
| 2005/0127500 A1 | 6/2005 | Colgan et al. | |
| 2005/0280162 A1 | 12/2005 | Mok et al. | |
| 2006/0109630 A1 | 5/2006 | Colgan et al. | |

* cited by examiner

*Primary Examiner*—Gregory D Thompson
(74) *Attorney, Agent, or Firm*—Connolly Bove Lodge & Hutz LLP; Daniel P. Morris

(57) ABSTRACT

Integrated circuit-chip hot spot temperatures are reduced by providing localized regions of higher thermal conductivity in the conductive material interface at pre-designed locations by controlling how particles in the thermal paste stack- or pile-up during the pressing or squeezing of excess material from the interface. Nested channels are used to efficiently decrease the thermal resistance in the interface, by both allowing for the thermally conductive material with a higher particle volumetric fill to be used and by creating localized regions of densely packed particles between two surfaces.

19 Claims, 5 Drawing Sheets

Hot spot with 3x-4x average power density

Hot spot with 3x-4x average power density flat surface corner-to-corner channels corner-corner & side-side
channels equal width & depth

METHOD OF OBTAINING ENHANCED LOCALIZED THERMAL INTERFACE REGIONS BY PARTICLE STACKING

This application is a Continuation of U.S. application Ser. No. 11/358,501, filed Feb. 21, 2006, now U.S. Pat. No. 7,394,657, with an issue date of Jul. 1, 2008, the entire contents of all are hereby incorporated by reference.

TECHNICAL FIELD

The present disclosure is concerned with reducing the thermal resistance between a heat source and a cooling device and particularly between an integrated circuit chip and a heat sink or heat spreader. According to the present disclosure, chip hot-spot temperatures are reduced by creating regions of higher thermal conductivity in the interface between the chip and heat sink or heat spreader during bondline formation.

BACKGROUND

Thermal interfaces in microelectronics packages are commonly credited with a majority of the resistance for heat to escape from the chip to the attached cooling device (e.g. heat sinks, spreaders and the like). Thus, in order to minimize the thermal resistance between the heat source and cooling device, a thermally conductive paste, thermal grease or adhesive that contains thermally conductive particles is commonly used. On the chip side—(heat source) there usually exists hotspots, areas of higher power density, where most of the processing takes place, which results in a temperature gradient across the chip. These areas of higher heat and power density must be kept within a set temperature range in order for the chip to perform properly and to pass quality and specification tests at the end of manufacturing.

Control of temperature distribution has recently been addressed by changing chip design/architecture. However this requires expensive redesign of the microprocessor that may influence other operating parameters and does not address the present issues facing current high performance microprocessors. Current means to increase the heat dissipation of the microprocessor include mechanical cap standoffs in direct contact between the chip and heat sink (June et al., "*Using Cap-Integral Standoffs to Reduce Chip Hot-Spot Temperatures in Electronic Packages*", 2002 Inter Society Conference on Thermal Phenomena); patterned surfaces with protrusions to reduce the thermal path; or direct water cooling targeted to cool the hot spots using liquid cooling (http://cooligy.com; http://www.apple.com/powermac/design.html and Bash et al. "*Improving heat transfer from a flip-chip package-Company Business and Marketing*", Hewlett-Packard Journal, August 1997). All of these approaches require either complex modifications of the package lids, caps or heat sink, and or expensive water cooling with pumps, fluidic interconnects and heat exchangers.

The aforementioned methods of reducing the thermal resistance between the chip and heat sink all have one thing in common: a thermal paste/adhesive or other medium softer than the two other surfaces is always placed between the heat source and sink in order to reduce the effect of manufacturing and assembly tolerances and to simplify assembly and reworkability. The material used in these layers is usually engineered to have a low as possible thermal resistance.

Accordingly, it would be desirable to provide for reduced thermal resistance between a heat source and cooling device that is both efficacious and yet not require changes to the microprocessor fabrication process.

SUMMARY OF THE INVENTION

According to the present disclosure, chip hot-spot temperatures are reduced by creating regions of higher thermal conductivity in the thermally conductive interface material during bondline formation.

More particularly, one aspect of the present disclosure relates to a microelectronic structure comprising an integrated circuit chip;

a heat sink adjacent the integrated circuit chip; wherein the heat sink contains nested channel arrays located opposite the vicinity of hot spots on the integrated circuit chip; and a thermally conductive composition containing thermally conductive particles located between the heat sink and integrated circuit chip and containing higher concentration of conductive particles in the nested channel arrays.

A further aspect of the present disclosure relates to a method for fabricating a microelectronic structure comprising providing an integrated circuit chip;

providing a heat sink or cooling device, such as a thermoelectric cooler or microchannel cooler, adjacent the integrated circuit chip; wherein the heat sink contains nested channel arrays located opposite the vicinity of hot spots on the integrated circuit chip;

providing a fluid thermally conductive composition containing thermally conductive particles between the integrated circuit chip and heat sink; and pressing the integrated chip and heat sink together causing the thermally conductive material to flow outward from the vicinity of the center and to thereby provide higher concentration of the thermally conductive particles in the nested channel arrays.

In preferred embodiments, the process provides regions of optimum or substantially optimum particle packing and thermal conductivity at the center of the channel array.

Still other objects and advantages of the present disclosure will become readily apparent by those skilled in the art from the following detailed description, wherein it is shown and described only the preferred embodiments, simply by way of illustration of the best mode. As will be realized, the disclosure is capable of other and different embodiments, and its several details are capable of modifications in various obvious respects, without departing from the disclosure. Accordingly, the description is to be regarded as illustrative in nature and not as restrictive.

BEST AND VARIOUS MODES

In order to facilitate a further understanding of the present disclosure, reference will be made to the figures, which are presented for purposes of illustration and not to limit the disclosure.

According to the present disclosure, the thermal conductivity at desired locations can be increased by controlling how particles in the thermally conductive fluid composition or composite (e.g.—paste, grease or adhesive) stacks—or piles-up during the squeezing of excess material from the interface. Localized particle stacking is controlled using a properly designed nested micro-channel array on one of the interface surfaces such as the heat sink or spreader or an attached cooling device. The array of nested channels is designed around the known hotspot regions of the corresponding chip.

The advantage of this solution is that it further reduces chip temperatures through only a small modification to the chip cap surface and does not require changes to the manufacturing line or the addition of more components to the system such as liquid coolants and microchannel heat exchangers.

Figure 1:
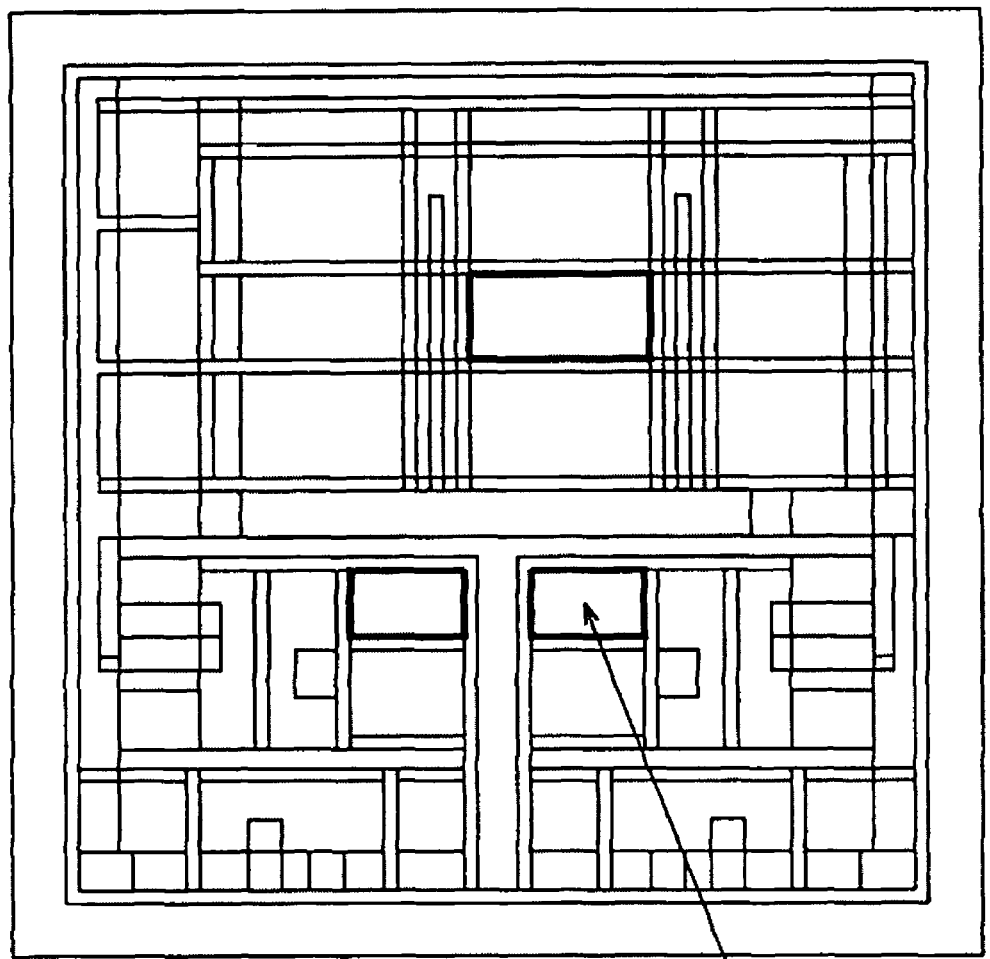
FIG. 1 illustrates hot spot locations on a sample chip.

As previously mentioned, hot spots (areas with higher power density) typically occur where most of the processing takes place. As an example of this, FIG. 1 shows the thermal map of an IBM Power5 Microprocessor. The areas of higher power density operate at higher temperatures than the rest of the chip. These areas typically operate at 2-4 degrees higher than the surrounding areas.

Figure 2A:
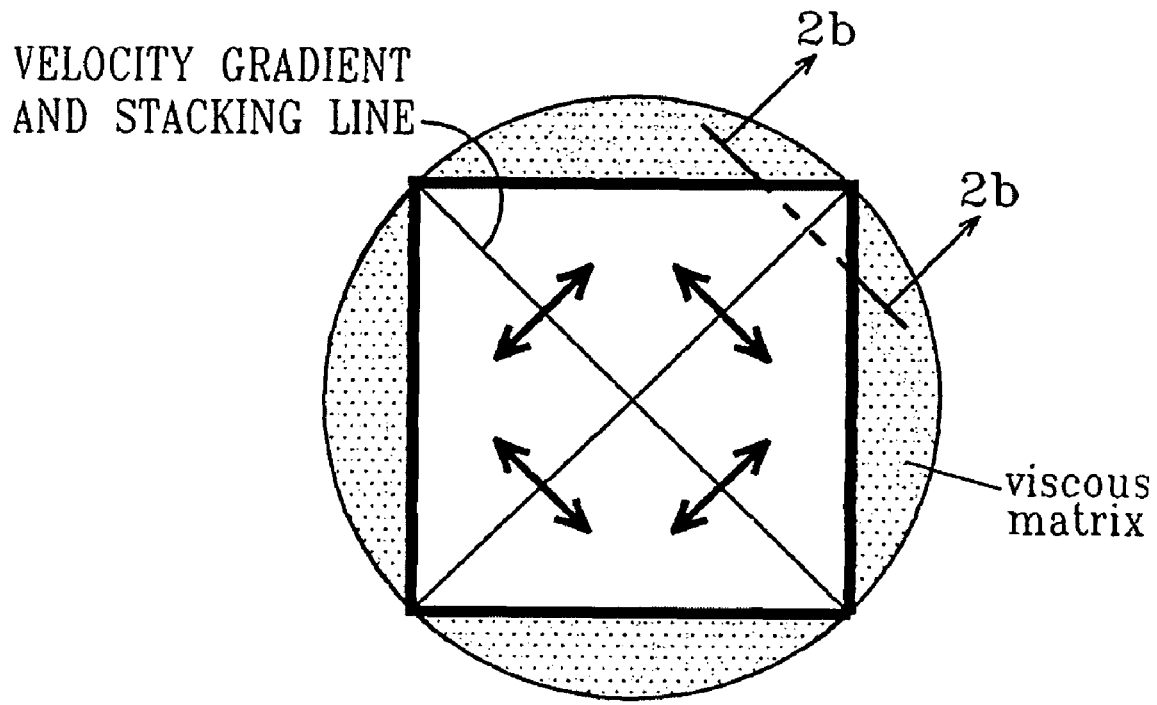
FIG. 2a is a top view of corner to corner velocity gradient and X-shaped particle stacking line as seen through a flat glass substrate.

Thermal interfaces are typically formed by pressing the heat sink or chip cap onto the backside of the processor chip with a particle filled viscous medium between, which is forced to flow into cavities or non-uniformities between the surfaces. As the interface material flows outward from the center, the edges of the chips are eventually reached and a velocity gradient develops along a line connecting opposite corners as shown in FIG. 2a. The velocity gradient is created due to the higher pressure drop along the chip center-to-corner path compared to the center-to-side path. For a relatively uniform gap and paste viscosity, the pressure drop is primarily a function of the length the viscous material must flow to reach the perimeter of the chip and thus it is highest for the center-to corner path.

Figure 2B:
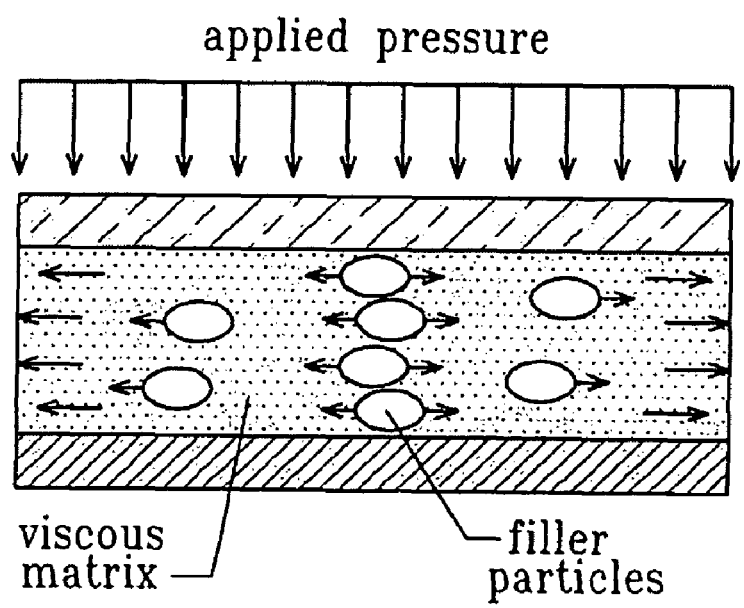
FIG. 2b is a cross sectional view of stacking phenomenon along velocity gradient during bondline formation.

During ideal bondline formation, a small volume of interface material initially along the velocity gradient would be evenly sheared in different directions as the bondline is continually pressed smaller. For a purely viscous fluid this shearing effect has no impact on the bondline formation. However, for a particle filled interface material, the shearing effect is the direct cause of particle stacking. When particles initially lie on the center-to-corner velocity gradient, they are pulled in opposite directions and as a result do not move with the viscous matrix but instead begin to pile up as the viscous matrix flows outward—forming a mechanical stop preventing further decreases in bondline thickness (see FIG. 2b).

Along stacking lines observed, there typically exists an excess of high conductivity and well packed particles. Because particle stacking is caused by the velocity gradient present in rectangular chip squeeze flow, it can be controlled by breaking up the gradients into more finely distributed regions using micro channels patterned on one of surfaces.

Figure 3A:
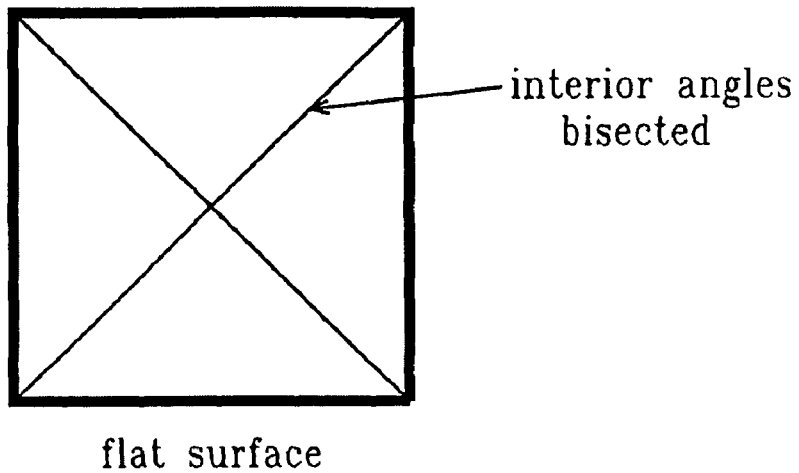
FIGS. 3a-3c illustrates control of stacking lines (with higher particle density) obtained by nested channels which are added to the substrate.
Figure 3B:
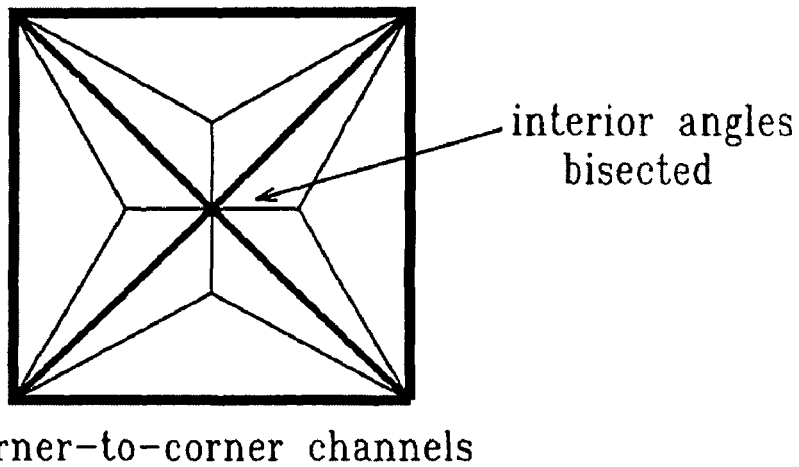
Figure 3C:
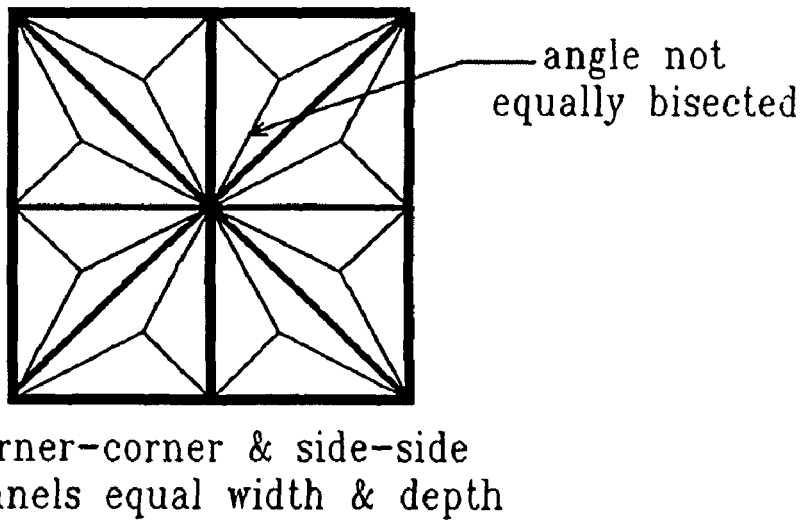

One major difference between the stacking patterns of FIGS. 3a-3c above is the far right substrate does not have a stacking line that perfectly bisects the interior angles between channels into two equal halves. The stacking angle can be understood by comparing the pressure drop of two adjacent channels—if both channels have identical pressure drops then the interior angle will be equally bisected into two halves. When a difference in pressure drops exists then the stacking angle shifts closer to the channel with higher pressure drop. The pressure drop of two different channel designs can be predicted using existing fluidic models. This facilitates the use of the channel depth or width to control the location of the stacking clusters. Typically, the channels have a depth from, but not limited to, about 10 to about 300 micrometer and a width from about 10 to about 300 micrometer being more typical. The channels are typically located in the heat sink opposite hot spots on the backside of the chip or within the vicinity of the chip. The channels can span the entire chip area, if desired. However, the focal point of the channels or center point where the channels met would typically be over the hotspot. The particular configuration, location and dimensions of the channels can be tailored by those skilled in the art once they are aware of the present disclosure without undue experimentation depending upon the desired effect.

Figure 4:
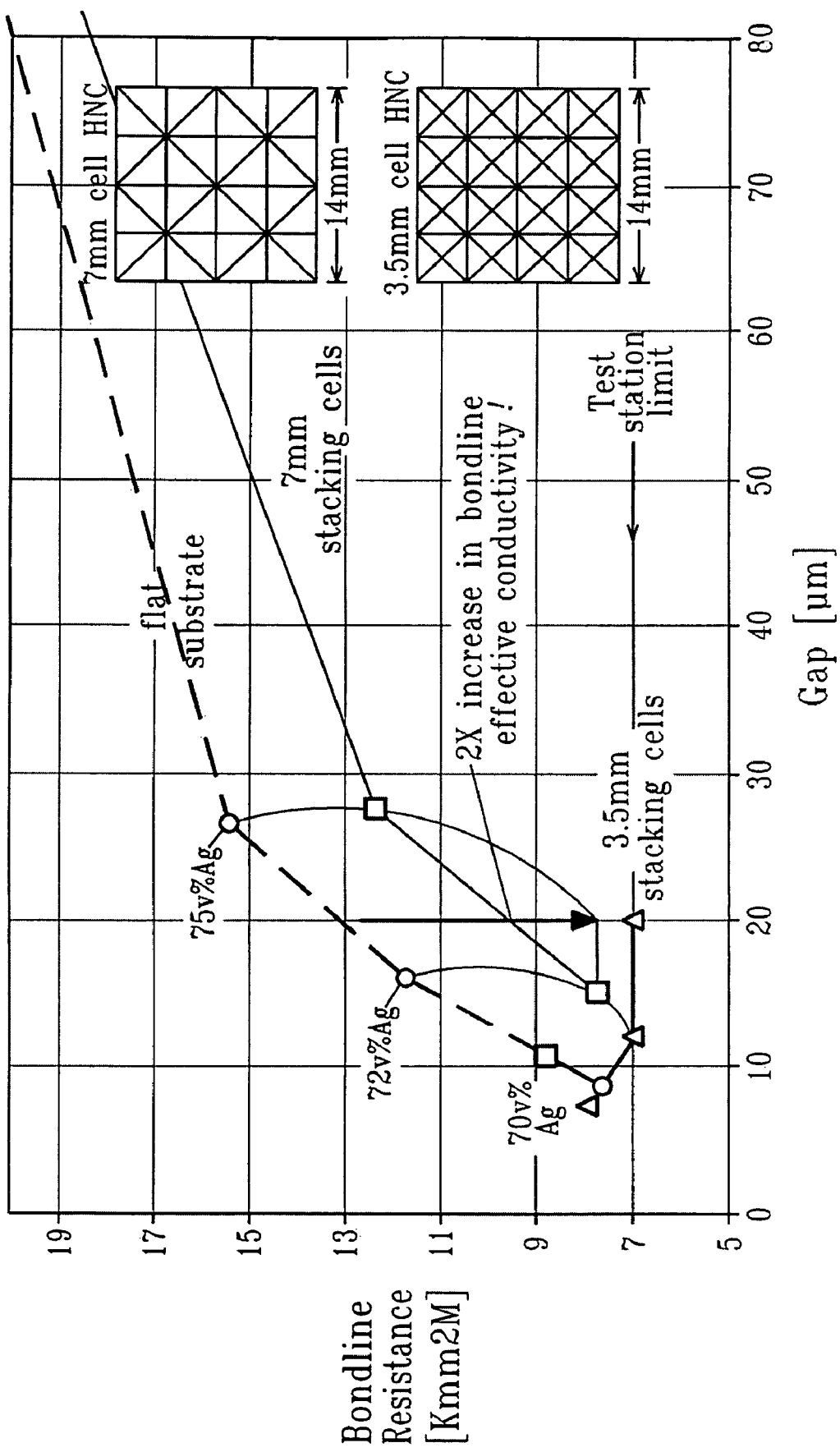
FIG. 4 shows measured decrease in bondline resistance using nested channel cells.

The measured decrease in bondline resistance using nested channel cells is clearly shown in FIG. 4. The term "nested" is use herein to mean a hierarchical system. In this case, it means that there are small sized channel networks "nested" within larger channel networks. Note how the resistance decreases, even with higher particle density, using nested channels when compared to the sharp increase in resistance using flat substrates. Furthermore, rather than attempting to minimize the overall interface resistance by controlling the gap separating the heat source and sink, the nested channels effectively reduce the thermal resistance by delaying stacking until the end of bondline formation at which time localized regions of increased particle density are formed. Lastly, FIG. 4 also illustrates how a denser stacking pattern further decreases the overall thermal resistance, which can easily be incorporated or designed around the known hotspot regions of the corresponding chip. In certain embodiments, it is desirable for the nested channels to have a small enough pitch in order to create an array of stacks with optimum thermal properties resulting from a dense packing of small and large particles with a minimum of void spaces between the particles. An HNC (hierarchical nested cell) cell size or channel pitch of less than 2 mm is typically used.

Figure 5:
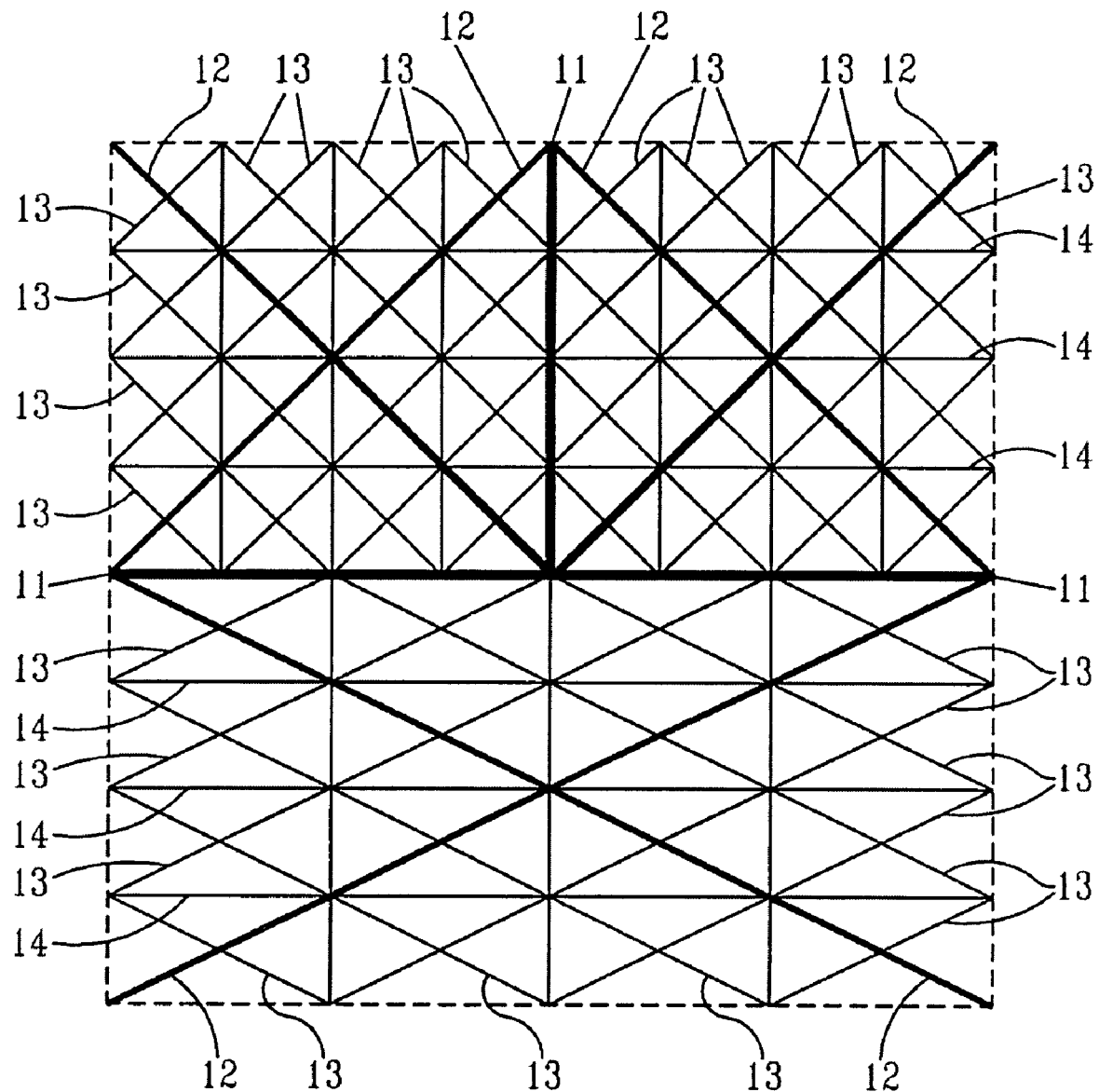
FIG. 5 shows controlling the location of stacking clusters by relative hydraulic diameter and direction of channels.

For the microprocessor illustrated in FIG. 1, there are two hot spots in the lower half of the chip and one region in the upper half with an elevated temperature. FIG. 5 illustrates an example of one approach to ensure a higher thermal conductivity for three regions of the microprocessor by properly varying the channel pattern across the surface. In FIG. 5, the dashed lines represent the edge of the chip. Typical width and depth dimensions for channels 11 are 300.times.300 microns in this example. Typical width and depth dimensions for channels 12 are 200.times.200 microns in this example. Channels 13 and 14 are smaller than channels 12 such as about 100-150 microns. Also, smaller channels can be further included, if desired, such as about 10 to about 50 microns and also nested within the triangular cells. Smaller channels are effective at re-directing the flow when the bondline gap is squeezed to less than approximately one half the hydraulic diameter of the channels. Thus, as an example, a 20 micron deep and wide channel is not useful for bondlines greater than 10 micron.

The overall concept of this invention is to design the nested channel arrays around the hotspots of the microprocessor so as to maximize interface thermal conductivity around these areas. Because the nested channels are added to the package lids/caps/heat sinks and the like, it does not require changes to the microprocessor fabrication process or the manufacturing and assembly line—only a modification to one surface of one component in the chip package.

The best performance it typically achieved employing a paste or adhesive that is mixed with a higher loading of particles (e.g. typically at least about 70% by volume and more typically about 70% to about 90% by volume) and smaller particle size range (e.g. about 0.5 to about 10 microns, and more typically about 0.5 to about 2 microns) than would conventionally be used with two flat surfaces. The conductive particles may also be nano particles. The exact amount of additional particle loading depends upon the particle sizes and the matrix oil into which they are mixed. Such will become apparent to those skilled in the art once they are aware of the present disclosure and need not be described in any further detail herein. A typical matrix oil viscosity is about 5 to about 20 Stokes; however, when a higher viscosity matrix oil is used (about 50 to about 200 Stokes), a higher volumetric loading of particles can be mixed with the oil to increase performance with the nested channel surfaces. The thermally conductive pastes, greases or adhesives contain particles of a highly thermoconductive material such as alumina, beryllium, copper, silver, or graphite.

The foregoing description illustrates and describes the disclosure. Additionally, the disclosure shows and describes only the preferred embodiments but, as mentioned above, it is to be understood that it is capable to use in various other combinations, modifications, and environments and is capable of changes or modifications within the scope of the invention concepts as expressed herein, commensurate with the above teachings and/or the skill or knowledge of the relevant art. The embodiments described herein above are further intended to explain best modes known by applicant and to enable others skilled in the art to utilize the disclosure in such, or other, embodiments and with the various modifications required by the particular applications or uses thereof. Accordingly, the description is not intended to limit the invention to the form disclosed herein. Also, it is intended to the appended claims be construed to include alternative embodiments.

All publications and patent applications cited in this specification are herein incorporated by reference, and for any and all purposes, as if each individual publication or patent application were specifically and individually indicated to be incorporated by reference.

What is claimed is:

1. A microprocessor comprising a microelectronic structure comprising
   an integrated circuit chip;
   a heat sink or cooling device adjacent the integrated circuit chip;
   wherein the heat sink or cooling device contains nested channel arrays located opposite the vicinity of hot spots on the integrated circuit chip;
   and a thermally conductive composition containing thermally conductive particles located between the heat sink or cooling device and the integrated circuit chip and containing a higher concentration of conductive particles: in the vicinity of hot spots on the integrated circuit chip;
   wherein an interior angle between two adjacent channels of the nested channel arrays is not equally bisected.

2. The microprocessor of claim 1 wherein the channels have a depth of about 10 to about 300 micrometers and a width of about 10 to about 300 micrometers.

3. The microprocessor of claim 1 wherein the hot spots are at least 2.degree. C. higher than other portions of the chip.

4. The microprocessor of claim 1 wherein the conductive particles are micro or nano particles.

5. The microprocessor of claim 1 wherein the conductive particles have particle size of about 0.5 micron to about 10 microns.

6. The microprocessor of claim 1 wherein the conductive particles have particle size of about 0.5 micron to about 2 microns.

7. The microprocessor of claim 6 wherein the conductive composition contains at least about 70% by volume of the conductive particles.

8. The microprocessor of claim 1 wherein the conductive composition contains at least about 70% by volume of the conductive particles.

9. The microprocessor of claim 1 wherein the conductive composition has a matrix viscosity of about 5 to about 20 Stokes.

10. The microprocessor of claim 1, wherein the microprocessor is a IBM Power 5 Microprocessor®.

11. A method for fabricating a microprocessor comprising a microelectronic structure comprising
    providing an integrated circuit chip;
    providing a heat sink or a cooling device adjacent the integrated circuit chip; wherein the heat sink or cooling device contains nested channel arrays located opposite the vicinity of hot spots on the integrated circuit chip;
    providing a fluid thermally conductive composition containing thermally conductive particles between the integrated circuit chip and heat sink or cooling device; and
    pressing the integrated chip and heat sink or cooling device together causing the thermally conductive material to flow outward from the vicinity of the nested channel array center points and to thereby provide higher concentration of the thermally conductive particles directly over hot spot regions in the integrated circuit chip,
    wherein an interior angle between two adjacent channels of the nested channel arrays is not equally bisected.

12. The method of claim 11, wherein the channels have a depth of about 10 to about 300 micrometers and a width of about 10 to about 300 micrometers.

13. The method of claim 11 wherein the hot spots are at least 2° C. higher than other portions of the chip.

14. The method of claim 11, wherein the conductive particles are micro or nano particles.

15. The method of claim 11, wherein the conductive particles have particle size of about 0.5 micron to about 10 microns.

16. The method of claim 11, wherein the conductive particles have particle size of about 0.5 micron to about 2 microns.

17. The method of claim 15 wherein the conductive composition contains at least about 70% by volume of the conductive particles.

18. The method of claim 11, wherein the conductive composition contains at least about 70% by volume of the conductive particles.

19. The method of claim 11, wherein the conductive composition has a viscosity of about 5 to about 20 Stokes.

* * * * *